US008586958B2

(12) United States Patent
Sakamoto et al.

(10) Patent No.: US 8,586,958 B2
(45) Date of Patent: Nov. 19, 2013

(54) SWITCHING ELEMENT AND MANUFACTURING METHOD THEREOF

(75) Inventors: Toshitsugu Sakamoto, Tokyo (JP); Yukihide Tsuji, Tokyo (JP); Munehiro Tada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/139,553

(22) PCT Filed: Jan. 8, 2010

(86) PCT No.: PCT/JP2010/050154
§ 371 (c)(1),
(2), (4) Date: Jun. 14, 2011

(87) PCT Pub. No.: WO2010/079829
PCT Pub. Date: Jul. 15, 2010

(65) Prior Publication Data
US 2011/0260133 A1 Oct. 27, 2011

(30) Foreign Application Priority Data

Jan. 9, 2009 (JP) ................................. 2009-004045

(51) Int. Cl.
*H01L 29/04* (2006.01)
*H01L 47/00* (2006.01)
*H01L 21/20* (2006.01)

(52) U.S. Cl.
USPC ........................ 257/3; 257/E45.002; 438/382

(58) Field of Classification Search
USPC .................. 257/2, 3, 613, E45.003, E21.052, 257/E45.001, E45.002; 438/382
See application file for complete search history.

(56) References Cited

U.S. PATENT DOCUMENTS

| 8,124,954 B2* | 2/2012 | Wang et al. ........................ 257/3 |
| 8,242,478 B2* | 8/2012 | Sakamoto .......................... 257/2 |
| 2004/0053496 A1* | 3/2004 | Choi ............................. 438/680 |
| 2005/0127524 A1* | 6/2005 | Sakamoto et al. ............ 257/774 |
| 2005/0226036 A1* | 10/2005 | Aratani et al. ................. 365/158 |
| 2006/0049390 A1* | 3/2006 | Ufert et al. ......................... 257/4 |
| 2006/0273429 A1* | 12/2006 | Sakamoto et al. ............. 257/613 |
| 2008/0265285 A1* | 10/2008 | Kozicki ........................ 257/202 |

(Continued)

FOREIGN PATENT DOCUMENTS

| JP | 2006319028 A | 11/2006 |
| JP | 2008-244090 A | 10/2008 |

(Continued)

OTHER PUBLICATIONS

International Search Report for PCT/JP2010/050154 mailed Feb. 9, 2010.

(Continued)

*Primary Examiner* — Matthew Landau
*Assistant Examiner* — Latanya N Crawford

(57) ABSTRACT

A switching element includes: a first electrode supplying metal ions; a second electrode less ionizable than the first electrode; and an ion conducting layer arranged between the first electrode and the second electrode and containing a metal oxide that can conduct the metal ions. The ion conducting layer includes two or more layers of different types, and one of the ion conducting layers that is closest to the first electrode has a larger diffusion coefficient for the metal ions than that of the other ion conducting layer(s).

9 Claims, 10 Drawing Sheets

(EXAMPLE 1)

(56) References Cited

U.S. PATENT DOCUMENTS

| | | | |
|---|---|---|---|
| 2008/0304130 A1* | 12/2008 | Nguyen | 359/265 |
| 2009/0014708 A1* | 1/2009 | Sasago et al. | 257/4 |
| 2009/0014770 A1* | 1/2009 | Terao et al. | 257/314 |
| 2010/0165543 A1* | 7/2010 | Lee | 361/435 |

FOREIGN PATENT DOCUMENTS

| | | | |
|---|---|---|---|
| JP | 2009021431 A | | 1/2009 |
| WO | 2006070693 A | | 7/2006 |
| WO | 2006070773 A | | 7/2006 |
| WO | 2007114099 A | | 10/2007 |
| WO | WO 2008001712 A1 | * | 1/2008 |
| WO | 2009078251 A | | 6/2009 |
| WO | 2009157479 A | | 12/2009 |

OTHER PUBLICATIONS

S. Kaeriyama et al., "A Nonvolatile Programmable Solid-Electrolyte Nanometer Switch", IEEE Journal of Solid-State Circuits, vol. 40, No. 1, Jan. 2005, pp. 168-176.

T. Sakamoto et al., "A Ta2O5 solid-electrolyte switch with improved reliability". 2007 Symposium on VLSI Technology Digest of Technical Papers, 3B-4, 2007, pp. 38-39.

Japanese Office Action for JP Application No. 2010-545793 mailed on Sep. 17, 2013 with Partial English Translation.

* cited by examiner (EXAMPLE 1)

FIG. 2A (EXAMPLE 1)
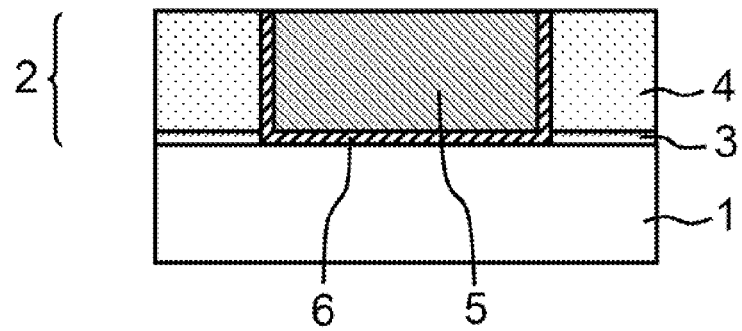
FIG. 2B (EXAMPLE 1)
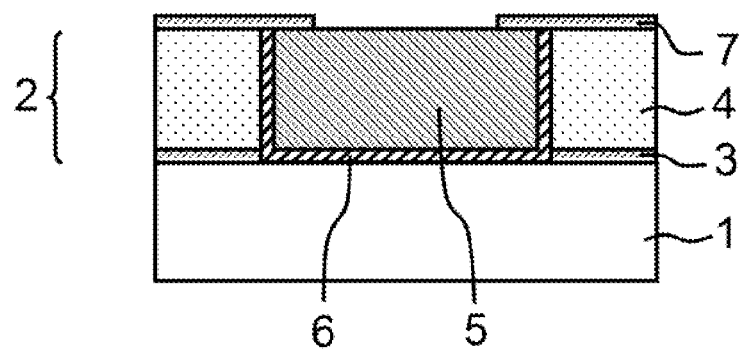
FIG. 2C (EXAMPLE 1)
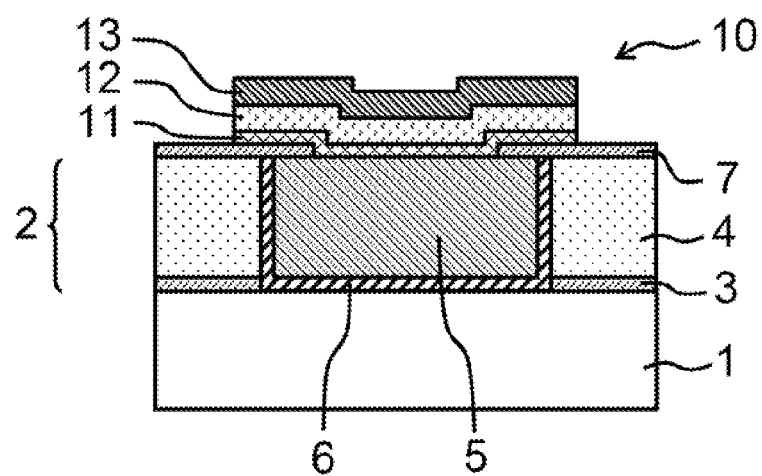

FIG. 3A (EXAMPLE 1)
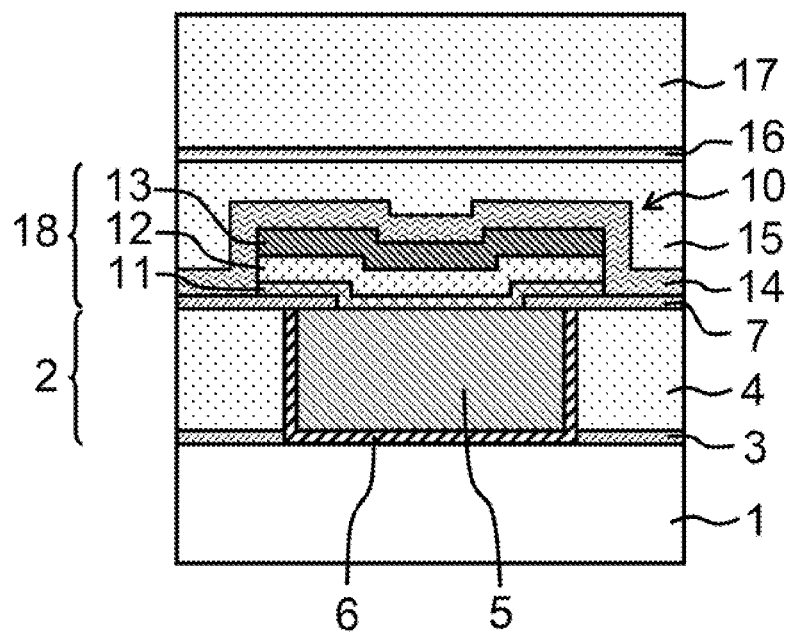
FIG. 3B (EXAMPLE 1)
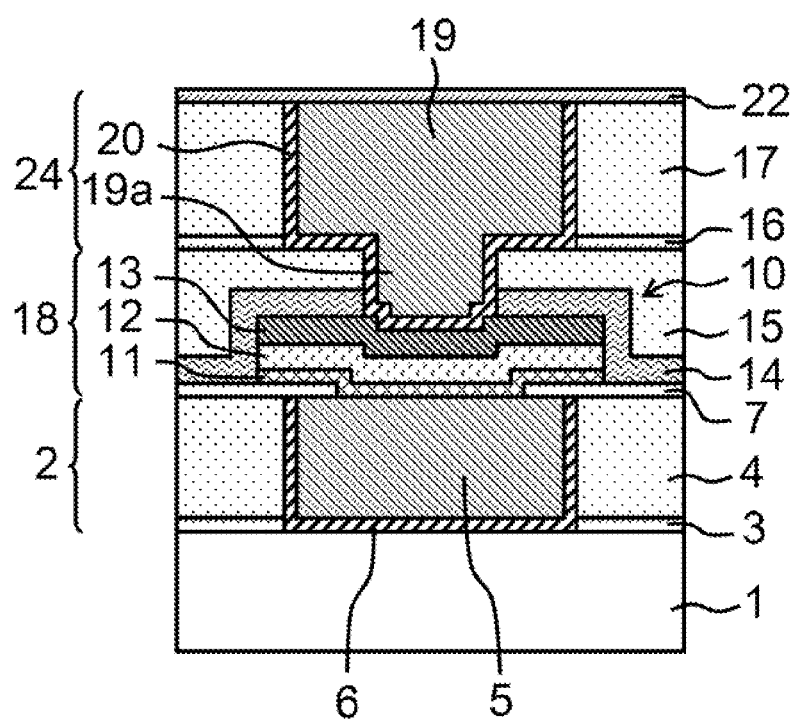

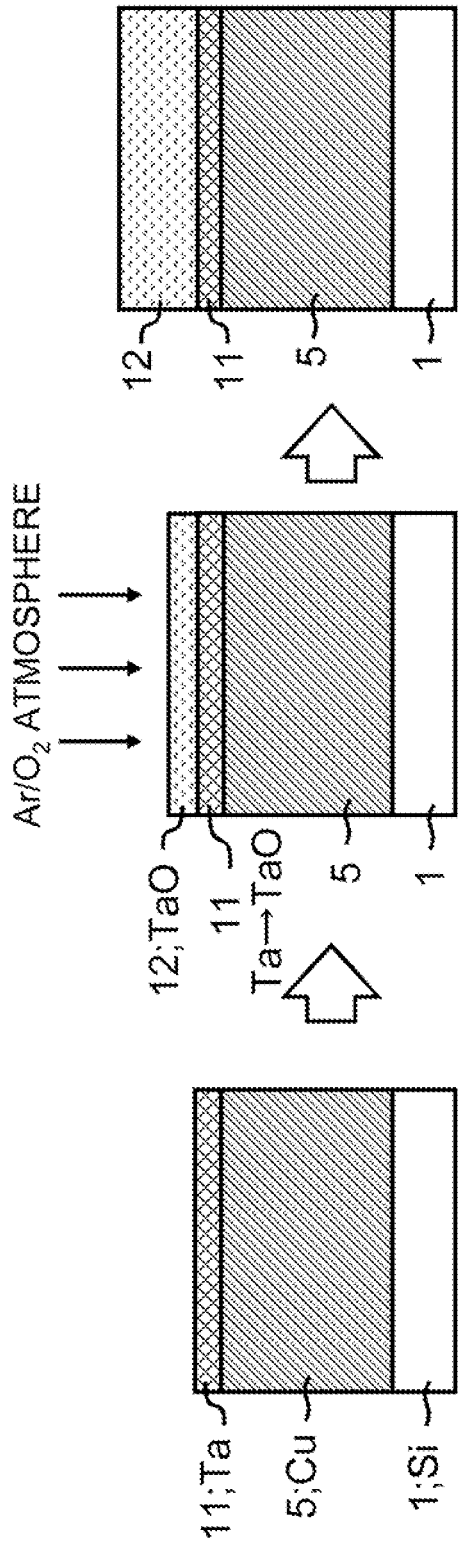

FIG. 5 (EXAMPLE 1-1)
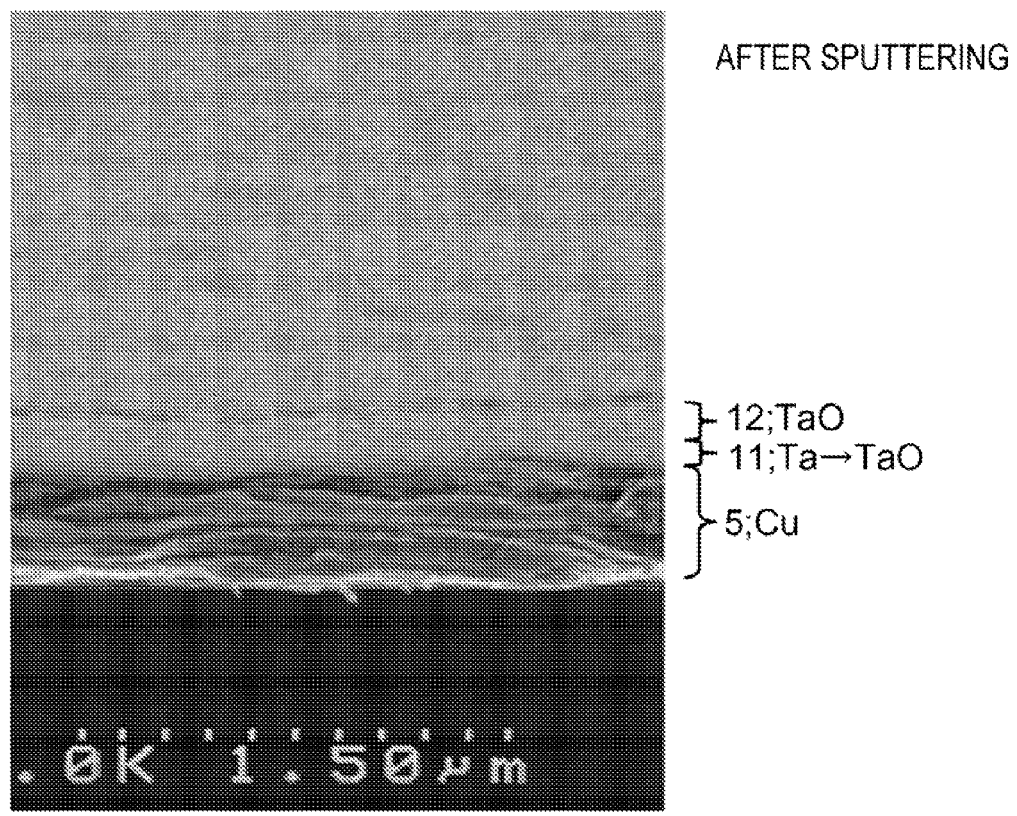

FIG. 6A (EXAMPLE 1-2)  FIG. 6B (EXAMPLE 1-2)  FIG. 6C (EXAMPLE 1-2)
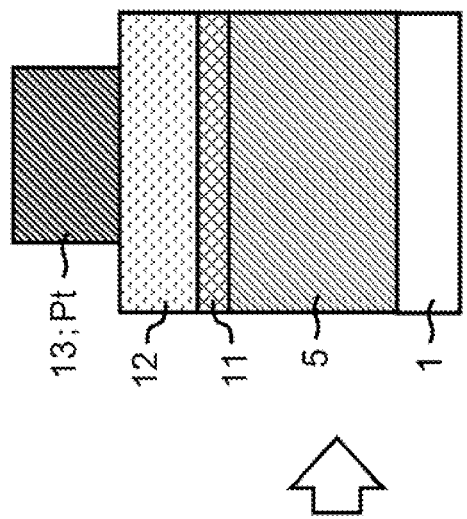
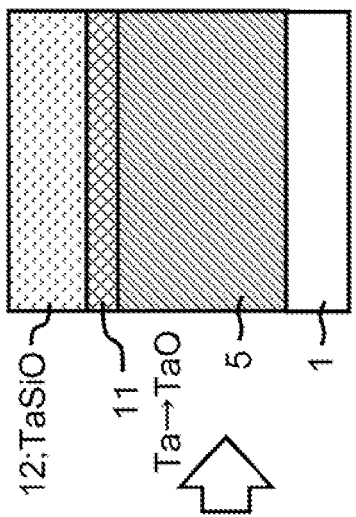
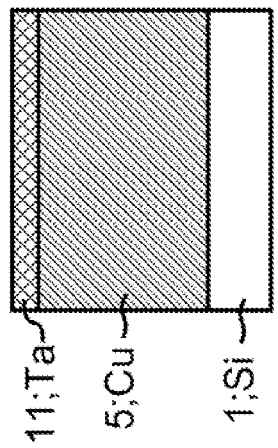
FORMATION OF BARRIER METAL LAYER
FORMATION OF ION CONDUCTING LAYER
FORMATION OF SECOND ELECTRODE

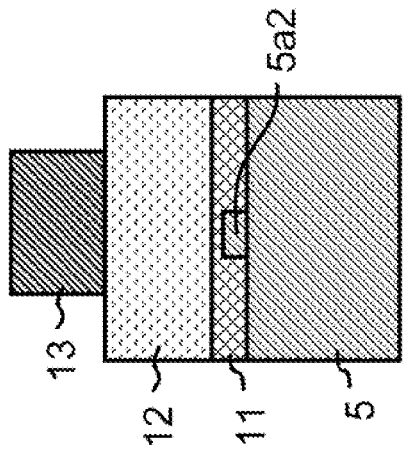
FIG. 7A (EXAMPLE 1-2) REWRITE OPERATION
LOW RESISTANCE STATE
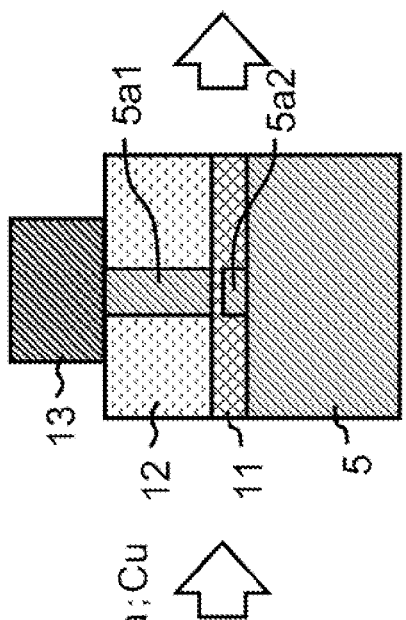
FIG. 7B (EXAMPLE 1-2) REWRITE OPERATION
CUT-OFF BRIDGE
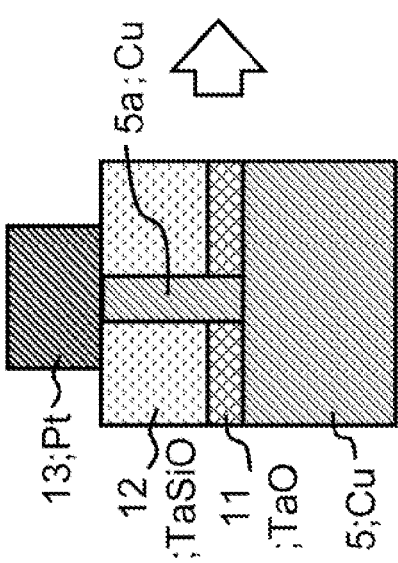
FIG. 7C (EXAMPLE 1-2) REWRITE OPERATION
METAL-RECOVERY OF METAL BRIDGE

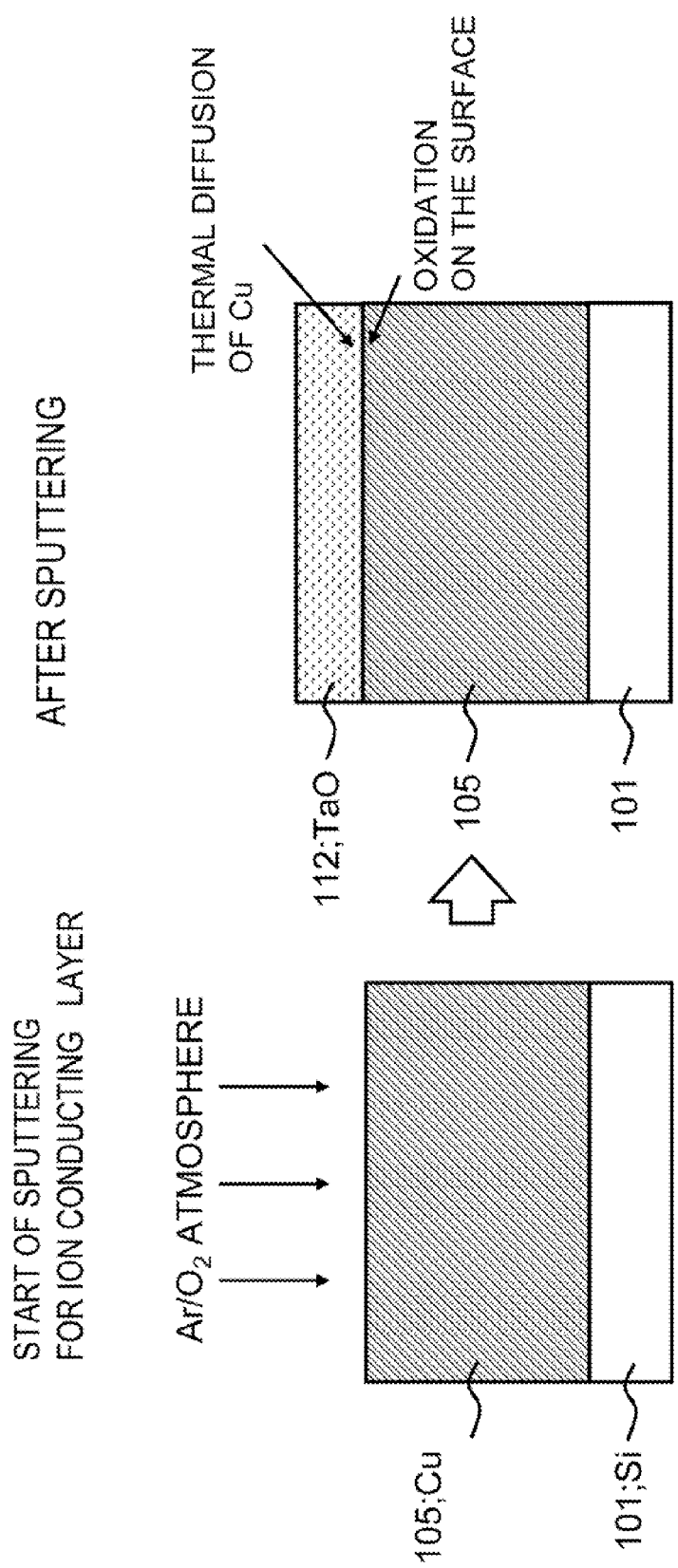

FIG. 9 (COMPARATIVE)
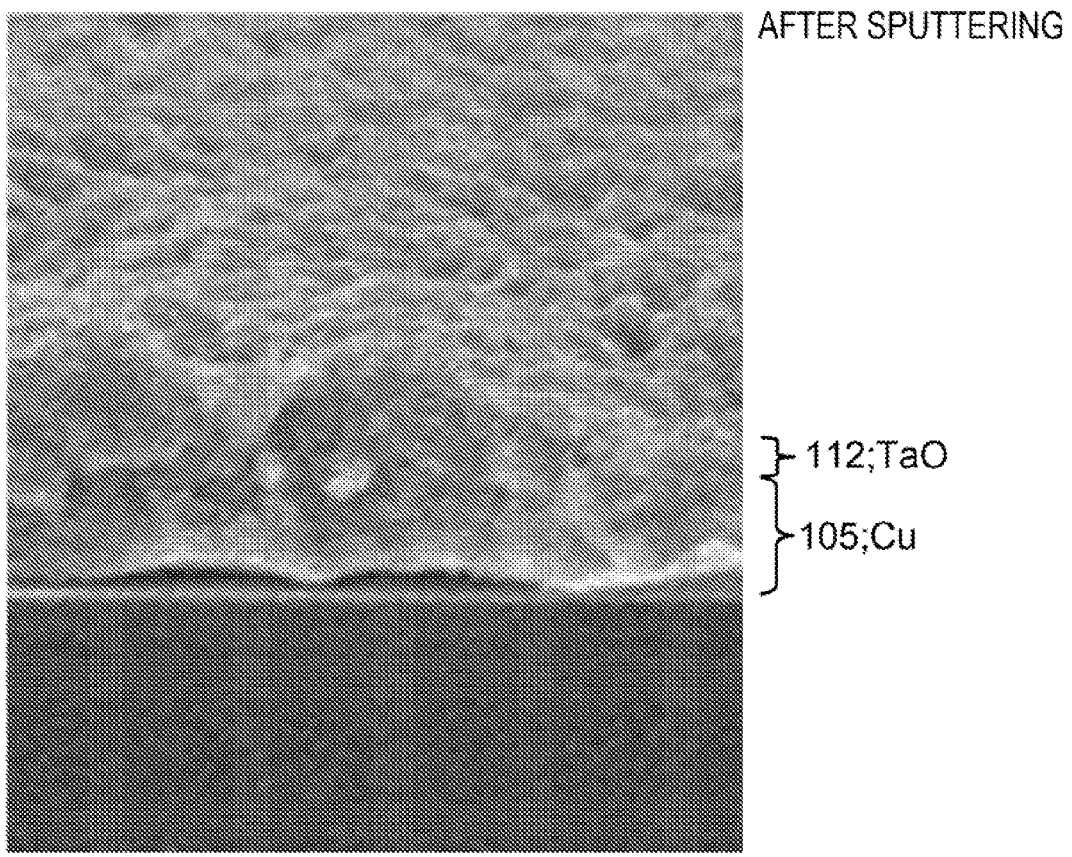

FIG. 10A (COMPARATIVE) REWRITE OPERATION
LOW RESISTANCE STATE

113; Pt
105a; Cu
112; TaO
105; Cu

FIG. 10B (COMPARATIVE) REWRITE OPERATION
CUT-OFF BRIDGE 113
105a1
112
105a2
105

FIG. 10C (COMPARATIVE) REWRITE OPERATION
METAL-RECOVERY OF METAL BRIDGE 113
112
105a2
105

SWITCHING ELEMENT AND MANUFACTURING METHOD THEREOF

REFERENCE TO RELATED APPLICATION

This application is the National Phase of PCT/JP2010/050154, filed Jan. 8, 2010, which is based upon and claims the benefit of the priority of Japanese patent application No. 2009-4045 filed on Jan. 9, 2009, the disclosure of which is incorporated herein in its entirety by reference thereto.

TECHNICAL FIELD

The present invention relates to a switching element used for a programmable logic or a memory and to a manufacturing method of the switching element. In particular, it relates to a switching element utilizing an electrochemical reaction and a manufacturing method of the switching element.

BACKGROUND

As a nonvolatile switch used for a memory element or a programmable logic of which semiconductor device circuit configuration can be changed, a switching element utilizing metal ion movement and an electrochemical reaction in an ion conductor (a solid substance in which ions can freely move) is disclosed (see Non-Patent Document 1, for example). This switching element disclosed in Non-Patent Document 1 comprises three layers of an ion conducting layer, a first electrode, and a second electrode. The first and second electrodes abut and sandwich the ion conducting layer. The first electrode serves to supply metal ions to the ion conducting layer. The second electrode does not supply any metal ions. A switching element utilizing such electrochemical reaction is featured by its small size and its large resistance ratio between an on-state and an off-state.

Immediately after manufactured, the switching element utilizing such electrochemical reaction is in an off-state and the resistance thereof is high. To change the switching element from an off-state to an on-state, the first electrode is connected to ground, and a negative voltage is applied to the second electrode. Because of an electrochemical reaction, metal ions are generated from metal of the first electrode and are dissolved in the ion conducting layer. Next, the metal ions in the ion conducting layer are precipitated on a surface of the second electrode as metal. The precipitated metal forms a metal bridge connecting the first electrode and the second electrode. Since this metal bridge electrically connects the first electrode and the second electrode, the switching element is brought in an on-state. On the other hand, to change the switching element from an on-state to an off-state, a positive voltage is applied to the second electrode, while maintaining the connection of the first electrode to ground. As a result, part of the metal bridge is cut off, and the switching element is brought in an off-state.

The switching element utilizing the electrochemical reaction is formed in a multilevel wiring layer structure of a semiconductor device or the like. The switching element includes three layers of a first electrode that can supply metal ions, an ion conducting layer that can conduct metal ions, and a second electrode that is less ionizable (namely, less oxidizable) than the first electrode. Based on the switching element disclosed in Patent Document 1, copper ions are used as the metal ions. In addition, copper is used as the first electrode supplying the copper ions, a metal oxide layer made of tantalum oxide or the like is used as the ion conducting layer, and platinum is used as the less ionizable second electrode.

Patent Document 1:
Japanese Patent Kokai Publication No. JP-P2006-319028A
Non-Patent Document
Non-Patent Document 1:
Shunichi Kaeriyama et al., "A Nonvolatile Programmable Solid-Electrolyte Nanometer Switch", IEEE Journal of Solid-State Circuits, Vol.40, No.1, pp.168-176, January 2005.
Non-Patent Document 2:
Toshitsugu Sakamoto et al., "A $Ta_2O_5$ solid electrolyte switch with improved reliability", 2007 Symposium on VLSI Technology Digest of Technical Papers, pp.38-39, 2007.

SUMMARY

The entire disclosures of Patent Document 1 and Non-Patent Documents 1 and 2 are incorporated herein by reference thereto. The following analyses are given by the present invention.

The metal oxide layer used as the ion conducting layer can be formed by a PVD (Physical Vapor Deposition) method, an evaporation method, a sputtering method, a Metal Organic Chemical Vapor Deposition (MOCVD) method, execution of oxidation after metal formation, or the like. In either method, the ion conducting layer needs to be formed under oxygen atmosphere. In Patent Document 1, the ion conducting layer (tantalum oxide) is formed by a laser ablation method (a type of vapor deposition method) under oxygen atmosphere. If the first electrode supplying metal ions is formed first and the metal oxide layer used as the ion conducting layer is formed next, there is a possibility that the first electrode may be oxidized by the oxygen atmosphere during the formation of the metal oxide layer. Namely, since the first electrode supplies metal ions, the first electrode is easily oxidized in oxygen atmosphere. Particularly, oxidation is further accelerated by the plasma in the PVD method or the high temperature in the MOCVD method. In addition, there is a possibility that metal ions may be diffused from the first electrode into the metal oxide layer used as the ion conducting layer, which may decrease insulation properties of the ion conducting layer.

According to Non-Patent Document 2, to avoid oxidation of the first electrode supplying metal ions, the less oxidizable second electrode is formed first, the metal oxide layer used as the ion conducting layer is formed next, and the first electrode is formed last. In addition, according to Non-Patent Document 2, to prevent metal ions from diffusing from the first electrode into the metal oxide layer, no heat treatment is executed after the switching element is formed.

In recent years, copper has been used as a wiring material of a semiconductor device. By using a copper wiring also as the first electrode, the number of processing steps can be reduced. To use a copper wiring as the first electrode, the ion conducting layer needs to be formed on the first electrode. Even when the ion conducting layer is formed on the first electrode, prevention of the oxidation of the first electrode and prevention of the decrease of insulating properties of the ion conducting layer are demanded.

It is a primary object of the present invention to provide a switching element that can prevent the oxidation of the first electrode and the decrease of insulating properties of the ion conducting layer, even when the ion conducting layer is formed on the first electrode supplying metal ions, and to provide a manufacturing method of the switching element.

In a first aspect of the present invention, there is provided a switching element utilizing an electrochemical reaction, the switching element comprising: a first electrode supplying metal ions; a second electrode less ionizable than the first electrode; and an ion conducting layer arranged between the first electrode and the second electrode and containing a metal oxide that can conduct the metal ions, wherein the ion conducting layer includes two or more layers of different types, and wherein one of the ion conducting layers that is closest to the first electrode has a larger diffusion coefficient for the metal ions than that of the other ion conducting layer(s).

In a second aspect of the present invention, there is provided a switching element manufacturing method utilizing an electrochemical reaction, the switching element manufacturing method comprising the processes of: forming, on a first electrode supplying metal ions, a barrier metal layer preventing oxidation of the first electrode; forming an ion conducting layer containing a metal oxide that can conduct the metal ions on the barrier metal layer; and forming a second electrode less ionizable than the first electrode on the ion conducting layer, wherein the process of forming the ion conducting layer is executed in an oxygen atmosphere.

The following meritorious effects are obtained, however, without limitation.

Based on the switching element manufacturing method according to the present invention, when the ion conducting layer is formed under the oxygen atmosphere, the barrier metal layer on the first electrode can prevent oxidation of the first electrode. In addition, when oxidized, the barrier metal layer on the first electrode assume a larger metal-ion diffusion coefficient than the ion conducting layer. Thus, the barrier metal layer can prevent the thermal diffusion of metal ions from the first electrode into the ion conducting layer and can prevent the decrease of insulating properties of the ion conducting layer.

Based on the switching element according to the present invention, when the ion conducting layer is formed on the first electrode supplying metal ions, the ion conducting layer includes two or more layers of different types. Since, one of the ion conducting layer that is closest to the first electrode has a larger metal-ion diffusion coefficient than that of the other ion conducting layer(s), diffusion of the metal ions into the other ion conducting layer(s) is prevented. As a result, the decrease of insulating properties of the ion conducting layers as a whole can be prevented.

BRIEF DESCRIPTION OF THE DRAWINGS

FIGS. 2A to 2C show cross sections schematically illustrating a first processing stage of a manufacturing method of the semiconductor device to which the switching element according to example 1 of the present invention is applied.

FIGS. 3A and 3B show cross sections schematically illustrating a second processing stage of a manufacturing method of the semiconductor device to which the switching element according to example 1 of the present invention is applied.

FIGS. 4A to 4C show cross sections schematically illustrating some of the manufacturing processes of the switching element according to example 1-1 of the present invention.

FIG. 5 is an electron microscope photograph of a formed ion conducting layer of the switching element according to example 1-1 of the present invention.

FIGS. 6A to 6C show cross sections schematically illustrating some of the manufacturing steps of a switching element according to example 1-2 of the present invention.

FIGS. 7A to 7C schematically illustrate a rewrite operation of the switching element according to example 1-2 of the present invention: FIG. 7A, the switching element in a low resistance state; FIG. 7B, a bridge having been cut off; and FIG. 7C, a metal bridge having been recovered as metal.

FIGS. 8A and 8B show cross sections schematically illustrating some of the manufacturing processes of a switching element according to a comparative example.

FIG. 9 is an electron microscope photograph of a formed ion conducting layer of the switching element according to the comparative example.

FIGS. 10A to 10C schematically illustrate a rewrite operation of the switching element according to the comparative example: FIG. 10A, the switching element in a low resistance state; FIG. 10B, a bridge having been cut off; and FIG. 10C, a metal bridge having been recovered as metal.

PREFERRED MODES

Figure 1:
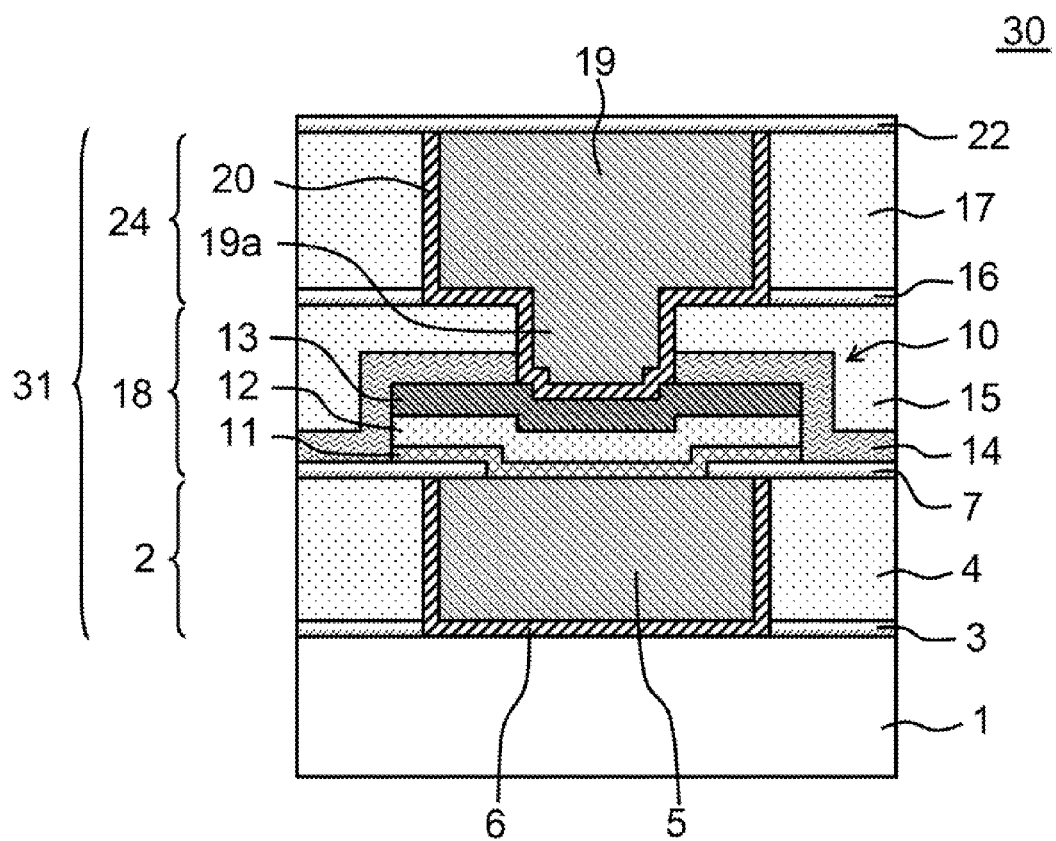
FIG. 1 is a partial cross section schematically illustrating a configuration of a semiconductor device to which a switching element according to example 1 of the present invention is applied.

A switching element according to exemplary embodiment 1 of the present invention comprises: a first electrode (5 in FIG. 1) supplying metal ions; a second electrode (13 in FIG. 1) less ionizable than the first electrode; and an ion conducting layer (11, 12 in FIG. 1) arranged between the first electrode and the second electrode and containing a metal oxide that can conduct the metal ions, wherein the ion conducting layer includes two or more layers of different types, and wherein one (11 in FIG. 1) of the ion conducting layers that is closest to the first electrode has a larger diffusion coefficient for the metal ions than that of the other ion conducting layer(s) (12 in FIG. 1) (mode 1).

In addition, the following modes are possible.

It is preferable that the ion conducting layer include two layers of a first ion conducting layer near the first electrode and a second ion conducting layer near the second electrode. In addition, it is preferable that the first ion conducting layer contain tantalum oxide and that the second ion conducting layer contain tantalum silicon oxide (mode 1-1).

It is preferable that the ion conducting layer include two layers of a first ion conducting layer near the first electrode and a second ion conducting layer near the second electrode. In addition, it is preferable that the first ion conducting layer contain chalcogenide and that the second ion conducting layer contain metal oxide (mode 1-2).

It is preferable that the first electrode be formed of copper and that the second electrode be formed of platinum (mode 1-3).

It is preferable that the first electrode be a first wiring arranged closer to a substrate than the ion conducting layer is to the substrate in a semiconductor device. In addition, it is preferable that the second electrode be arranged farther from the substrate than the ion conducting layer is from the substrate in the semiconductor device and be electrically connected to a second wiring in an upper layer (mode 1-4).

It is preferable that the second wiring be embedded in a trench or a prepared hole formed in an interlayer insulating film. In addition, it is preferable that the switching element further comprise a barrier metal arranged between the second electrode and the second wiring and between the interlayer insulating film and the second wiring, and the barrier metal is formed of a material identical to that of the second electrode (mode 1-5).

It is preferable that the switching element further comprise: a barrier insulating film arranged between the first electrode and the ion conducting layer and having an opening for connecting the first electrode and the ion conducting layer; and a protective insulating film covering the second electrode and the ion conducting layer for protection and bonded to the barrier insulating film at the periphery of the second electrode and the ion conducting layer. In addition, it is preferable that the protective insulating film be formed of a material identical to that of the barrier insulating film (mode 1-6).

A switching element manufacturing method according to exemplary embodiment 2 of the present invention comprises: forming, on a first electrode (5 in FIG. 2) supplying metal ions, a barrier metal layer (11 in FIG. 2) preventing oxidation of the first electrode; forming an ion conducting layer (12 in FIG. 2) containing a metal oxide that can conduct the metal ions on the barrier metal layer; and forming a second electrode (13 in FIG. 2) less ionizable than the first electrode on the ion conducting layer, wherein the forming the ion conducting layer is executed in oxygen atmosphere (mode 2).

In addition, the following modes are possible.

It is preferable that the barrier metal layer be formed of tantalum, tantalum nitride, or a multilayer laminate of these materials and that the metal oxide be formed of tantalum oxide or tantalum silicon oxide (mode 2-1).

It is preferable that the first electrode be formed of copper, and that the second electrode be formed of platinum (mode 2-2).

It is preferable that the forming the ion conducting layer be executed at room temperature (mode 2-3).

It is preferable that, in the forming the ion conducting layer, the barrier metal layer be oxidized and changed to an ion conducting layer containing a metal oxide (mode 2-4).

It is preferable that, in the forming the ion conducting layer, the barrier metal layer be oxidized and have a larger diffusion coefficient for the metal ions than that of the ion conducting layer (mode 2-5).

It is preferable that a heat treatment be executed in a step after the forming the second electrode and metal of the first electrode be diffused by the heat treatment (mode 2-6).

EXAMPLE 1

A switching element according to example 1 of the present invention will be described with reference to the drawings. FIG. 1 is a partial cross section schematically illustrating a configuration of a semiconductor device to which a switching element according to example 1 of the present invention is applied.

A switching element 10 according to example 1 is formed in a multilevel wiring layer structure 31 on a semiconductor substrate 1 of a semiconductor device 30.

In a first wiring layer 2 of the semiconductor device 30, a first barrier insulating film 3 is formed on the semiconductor substrate 1 covered with an insulating film (not illustrated; a silicon oxide film, for example). A first interlayer insulating film 4 is formed on the first barrier insulating film 3, and an opening extending to the semiconductor substrate 1 is formed in the first interlayer insulating film 4 and the first barrier insulating film 3. A first wiring 5 used as a first electrode is embedded in the opening via a first barrier metal 6.

In a plug layer 18 of the semiconductor device 30, a second barrier insulating film 7 having an opening extending to the first wiring 5 is formed on the first wiring layer 2. A barrier metal layer 11 is formed to cover the opening, and an ion conducting layer 12 is formed on the barrier metal layer 11. A second electrode 13 is formed on the ion conducting layer 12, and a protective insulating film 14 is formed on the second barrier insulating film 7 and on the second electrode 13 (as well as on the side wall surfaces of the second electrode 13, the ion conducting layer 12, and the barrier metal layer 11). A second interlayer insulating film 15 is formed on the protective insulating film 14, and an opening extending to the second electrode 13 is formed in the second interlayer insulating film 15 and the protective insulating film 14. A plug portion 19a of a second wiring 19 is embedded in the opening via a second barrier metal 20. A multilayer (laminated) portion formed by the first wiring layer 2, the barrier metal layer 11, the ion conducting layer 12, and the second electrode 13 serves as the switching element 10.

In a second wiring layer 24 of the semiconductor device 30, a third barrier insulating film 16 is formed on the second interlayer insulating film 15. An opening is formed in the third barrier insulating film 16, and this opening occupies the same region as that of the opening formed in the second interlayer insulating film 15 and the protective insulating film 14. A third interlayer insulating film 17 is formed on the third barrier insulating film 16, and an opening larger than the opening formed in the third barrier insulating film 16, the second interlayer insulating film 15, and the protective insulating film 14 is formed in the third interlayer insulating film 17. A wiring portion of the second wiring 19 is embedded in the opening via the second barrier metal 20. The region of the opening formed in the third interlayer insulating film 17 is arranged to cover the region of the opening formed in the third barrier insulating film 16, the second interlayer insulating film 15, and the protective insulating film 14. A wiring portion of the second wiring 19 is integrated with a plug portion 19a. A fourth barrier insulating film 22 is formed on the second wiring layer 24.

A silicon substrate having a surface covered with an insulating film (not illustrated; a silicon oxide film, for example) can be used as the semiconductor substrate 1.

The first barrier insulating film 3 is an insulating film arranged between the semiconductor substrate 1 and the first interlayer insulating film 4. The first barrier insulating film 3 serves as a hard mask when an opening is formed in the first interlayer insulating film 4. For example, a silicon nitride film can be used as the first barrier insulating film 3.

For example, a silicon oxide film or a low dielectric constant film (a low-k film such as a SiOCH film) can be used as the first interlayer insulating film 4. The first interlayer insulating film 4 may be formed by stacking a plurality of insulating films.

The first wiring 5 is a wiring that also serves as a first electrode that will become a source of supplying metal ions. The first wiring 5 is arranged closer to the semiconductor substrate 1 of the semiconductor device 30 than the ion conducting layer 12 is to the semiconductor substrate 1. The first wiring 5 is made of a metal with a larger ionization tendency than that of the second electrode 13. Generally, the first wiring 5 is made of copper.

The first barrier metal 6 is a barrier film formed to prevent the metal of the first wiring 5 from diffusing into the first interlayer insulating film 4 and the semiconductor substrate 1 when the first wiring 5 is formed. For example, tantalum nitride, titanium nitride, or the like can be used as the first barrier metal 6.

The second barrier insulating film 7 is a barrier film that prevents oxidation and diffusion of the metal of the first wiring 5. The second barrier insulating film 7 serves as a hard mask when the second electrode 13, the ion conducting layer 12, and the barrier metal layer 11 are etched. For example, SiN, SiCN, SiC, a multilayer laminate of such materials, or the like can be used as the second barrier insulating film 7. It is preferable that the second barrier insulating film 7 have a film thickness approximately of 10 nm to 50 nm.

When barrier metal of the barrier metal layer 11 is oxidized by a heat treatment, the barrier metal layer 11 is changed to an ion conducting layer containing metal oxide. A material obtained by oxidizing tantalum, tantalum nitride, or a multi-layer laminate of such materials can be used as the barrier metal layer 11 (particularly, tantalum oxide can be used). The barrier metal layer 11 serves to prevent the first wiring 5 (first electrode) from being oxidized when the ion conducting layer 12 is formed. When the ion conducting layer 12 is formed, oxidation starts from a surface of the barrier metal layer 11. Before the barrier metal layer 11 is oxidized, the barrier metal layer 11 is less susceptible to diffusion of metal ions as compared to the ion conducting layer 12. In an oxidized state, the barrier metal layer 11 has a larger metal-ion diffusion coefficient than that of the ion conducting layer 12. If made of tantalum, for example, the barrier metal layer 11 can have a film thickness of approximately 3 nm.

The ion conducting layer 12 is a layer containing a metal oxide that can conduct metal ions of the metal of the first wiring 5 (first electrode). It is preferable that the ion conducting layer 12 be an oxide insulating film containing tantalum as the metal oxide. For example, it is desirable that tantalum oxide or tantalum silicon oxide be used. If made of tantalum silicon oxide, for example, the ion conducting layer 12 can have a film thickness of approximately 13 nm.

In FIG. 1, the ion conducting layer between the first electrode 5 and the second electrode 13 is formed in a two layer-structure of the barrier metal layer 11 and the ion conducting layer 12. However, the ion conducting layer may be formed by three or more layers of different types. If the ion conducting layer between the first electrode 5 and the second electrode 13 is formed by two layers or more of different types, a metal bridge is cut off in an ion conducting layer having the largest metal-ion diffusion coefficient. Thus, by arranging such ion conducting layer having the largest metal-ion diffusion coefficient on the side of the first electrode 5, the metal bridge is cut off at a position close to the first electrode 5. Namely, the insulation resistance (breakdown-resistant property) during switching is improved. If formed by a plurality of layers, other than the combination of tantalum oxide and tantalum silicon oxide, the ion conducting layer may be formed by a combination of chalcogenide and metal oxide. The chalcogenide is a compound containing a chalcogen element (such as selenium, sulfur, or tellurium etc.) and having a larger metal-ion diffusion coefficient than that of a metal oxide. Examples of a preferable chalcogenide include copper sulfide, silver sulfide, germanium telluride selenide, germanium silver selenide, and germanium silver sulfide. Examples of a preferable metal oxide include titanium oxide, nickel oxide, aluminum oxide, zirconium oxide, hafnium oxide, gadolinium oxide, and tungsten oxide.

The second electrode 13 is arranged farther from the semiconductor substrate 1 of the semiconductor device 30 than the ion conducting layer 12 is from the semiconductor substrate 1 and is electrically connected to the second wiring 19. The second electrode 13 is made of a less ionizable material than that of the first wiring 5 (first electrode). It is preferable that the second electrode 13 be made of a metal material having a smaller absolute value in oxidation free energy than that of tantalum. For example, platinum, ruthenium, titanium, tantalum nitride, or a multilayer laminate of such materials can be used. If the second electrode 13 is made of a material identical to that of the second barrier metal 20, the contact resistance between the plug portion 19a and the second electrode 13 of the switching element 10 can be reduced. As a result, element performance can be improved (reduction in resistance of the switching element during ON). For example, if the second barrier metal 20 is made of a multilayer structure of tantalum nitride/tantalum, it is preferable that tantalum nitride, which is used as the bottom surface material of the second barrier metal 20, be used as the second electrode 13. Alternatively, if the second barrier metal 20 is made of a multilayer structure of titanium/ruthenium, it is preferable that titanium, which is used as the bottom surface material of the second barrier metal 20, be used as part of the second electrode 13.

The protective insulating film 14 is an insulating film to cover and protect the switching element 10. It is preferable that the protective insulating film 14 be made of a material that serves to prevent removal of oxygen from the switching element 10, without causing damage to the second electrode 13, the ion conducting layer 12, and the barrier metal layer 11 of the switching element 10. For example, silicon nitride or silicon carbonitride can be used. It is preferable that the protective insulating film 14 be made of a material identical to that of the second barrier insulating film 7. If made of an identical material, the protective insulating film 14 and the second barrier insulating film 7 can be integrated (solid) with each other, and as a result, the interface adherence can be improved.

For example, a silicon oxide film or a low dielectric constant film (a low-k film such as a SiOCH film etc.) can be used as the second interlayer insulating film 15. The second interlayer insulating film 15 may be formed by stacking a plurality of insulating films.

The third barrier insulating film 16 is an insulating film arranged between the second interlayer insulating film 15 and the third interlayer insulating film 17. The third barrier insulating film 16 serves as a hard mask when an opening is formed in the third interlayer insulating film 17. For example, silicon nitride, silicon carbide, silicon carbonitride, or a multilayer laminate of such materials etc. can be used as the third barrier insulating film 16.

For example, a silicon oxide film or a low dielectric constant film (a low-k film such as a SiOCH film) can be used as the third interlayer insulating film 17. The third interlayer insulating film 17 may be formed by stacking a plurality of insulating films.

The second wiring 19 can be formed by integrating the wiring portion and the plug portion 19a according to a dual-damascene method. For example, copper can be used as the second wiring 19.

The second barrier metal 20 is a barrier film formed to prevent the metal of the second wiring 19 from diffusing into the second interlayer insulating film 15 and the third interlayer insulating film 17 when the second wiring 19 is formed. For example, tantalum nitride, titanium nitride, ruthenium, tantalum, titanium, platinum, or a multilayer laminate of such materials etc. can be used as the second barrier metal 20. If the second barrier metal 20 is made of a material identical to that of the second electrode 13, the contact resistance between the plug portion 19a and the second electrode 13 of the switching element 10 can be reduced. As a result, element performance can be improved (reduction in resistance of the switching element during ON).

The fourth barrier insulating film 22 is an insulating film to prevent diffusion of the metal of the second wiring 19 into the upper layers. For example, a silicon nitride film can be used as the fourth barrier insulating film 22.

Next, a manufacturing method of the switching element according to example 1 of the present invention will be described with reference to the drawings. FIGS. 2 and 3 are cross sections schematically illustrating processing steps of a manufacturing method of a semiconductor device to which the switching element according to example 1 of the present invention is applied.

First, the first barrier insulating film 3 (a silicon nitride film, for example) is formed on the semiconductor substrate 1 (a silicon substrate, for example). Next, the first interlayer insulating film 4 (a silicon oxide film, for example) is formed. Next, by using a photolithography method, an opening extending to the semiconductor substrate 1 is formed in the first interlayer insulating film 4 and the first barrier insulating film 3. Next, the first barrier metal 6 (titanium nitride, for example) is formed on the first interlayer insulating film 4 including the opening. Next, the first wiring 5 (copper, for example) is formed on the first barrier metal 6. Next, the first wiring 5 and the first barrier metal 6 are planarized by CMP until the first interlayer insulating film 4 appears (see step A1 in FIG. 2A). As a result, the first wiring 5 is embedded in the opening formed in the first interlayer insulating film 4 and the first barrier insulating film 3 via the first barrier metal 6.

In step A1, for example, the first interlayer insulating film 4 can be formed by a plasma CVD method.

In addition, in step A1, for example, the first wiring 5 can be formed by: forming the first barrier metal 6, which is a multilayer laminate of TaN/Ta, by a PVD method; forming a Cu seed by a PVD method; embedding copper in the opening by an electrolytic plating method; executing heat treatment at a temperature of 290° C. or higher; and removing excess copper remaining outside the trench by a CMP method. While the wiring can be formed by such series of procedures, a general method known in the art can be used.

Next, the second barrier insulating film 7 (a silicon nitride film, for example) is formed on the first interlayer insulating film 4 including the first wiring 5 and the first barrier metal 6. Next, a hard mask film (not illustrated: SiC, for example) is formed on the second barrier insulating film 7. Thereafter, by using a photolithography method, an opening is formed in the hard mask film. Next, the second barrier insulating film 7 that is exposed in the opening in the hard mask film is etched back by dry etching until the first wiring 5 appears. Then, by executing an organic stripping process using an amine-based stripping solution or the like, oxidized copper formed on the exposed surface of the first wiring 5 and etching byproducts or the like deposited during the etch back are removed (see step A2 in FIG. 2B).

In step A2, the second barrier insulating film 7 can be formed by a plasma CVD method. It is preferable that the second barrier insulating film 7 have a film thickness of approximately 10 nm to 50 nm.

In addition, in step A2, it is preferable that the hard mask film formed on the second barrier insulating film 7 be made of a material different from that of the second barrier insulating film 7, in order to maintain a large etching selectivity during the dry etching process. The hard mask film may be an insulating film or a conducting film. For example, a silicon oxide film, TiN, Ti, Ta, TaN, or the like can be used as the hard mask film. In addition, in step A2, in the photolithography method, a photoresist is used on the hard mask film to pattern the opening. An opening pattern is transcribed in the hard mask film by dry etching, and the photoresist is stripped by oxygen plasma ashing or the like. Thereupon, the etch-back process by dry etching does not necessarily stop on the top surface of the second barrier insulating film 7. An inner portion of the second barrier insulating film 7 may also be dry-etched. While it is preferable that the hard mask film be completely removed during the etchingback, if the hard mask film is made of an insulating material, the hard mask film may be allowed to remain.

Next, the barrier metal layer 11 (tantalum, for example) is formed on the second barrier insulating film 7 and on the first wiring 5. Next, the ion conducting layer 12 (tantalum silicon oxide, for example) is formed on the barrier metal layer 11. Next, the second electrode 13 (a multilayer body of ruthenium and titanium, for example) is formed on the ion conducting layer 12. Next, a hard mask film (not illustrated, a multilayer body of silicon nitride film/silicon oxide film, for example) is formed on the second electrode 13. Next, by using a photolithography method, the hard mask film in a region other than a portion that needs to remain as the switching element 10 is etched and removed. Next, by using the remaining hard mask film as a mask, the second electrode 13, the ion conducting layer 12, and the barrier metal layer 11 are continuously etched (see step A3 in FIG. 2C).

In step A3, the barrier metal layer 11 can be formed as tantalum having a film thickness of 3 nm. The barrier metal layer 11 can be formed by a DC (Direct Current) sputtering method under argon atmosphere. The first electrode 5 is not oxidized when the barrier metal layer 11 is formed. The tantalum of the barrier metal layer 11 is more effective in preventing transmission of oxygen, compared with tantalum nitride. In addition, when tantalum and tantalum nitride, which are promising materials for the barrier metal layer 11, are compared, tantalum nitride is more effective in preventing thermal diffusion of copper. When the ion conducting layer 12 is formed by a sputtering method at a high temperature or when a heat treatment or the like is executed after the switching element 10 is formed, thermal diffusion of copper from the first electrode 5 needs to be prevented.

In addition, in step A3, the ion conducting layer 12 can be formed as tantalum silicon oxide having a film thickness of 13 nm. If made of tantalum silicon oxide, the ion conducting layer 12 can be formed by an RF (Radio Frequency) sputtering method under the conditions: argon-oxygen flow ratio at, 4:1; substrate temperature at, room temperature; and plasma power at, 2 kW.

In addition, in step A3, when the ion conducting layer 12 is formed by sputtering under oxygen atmosphere, oxidization progresses on a surface of the barrier metal layer 11. If the barrier metal layer 11 is completely oxidized during the sputtering to form the ion conducting layer 12, the first wiring 5 (first electrode) is supplied with oxygen. Thus, it is important that the barrier metal layer 11 have a predetermined film thickness or more.

In addition, in step A3, when the barrier metal layer 11 is oxidized, the barrier metal layer 11 changes to an ion conducting layer that can conduct metal ions. For example, if tantalum oxide is used as the ion conducting layer 12 and tantalum is used as the barrier metal layer 11, during the sputtering to form the ion conducting layer 12, the tantalum of the barrier metal layer 11 is oxidized and changed to tantalum oxide. Namely, by adjusting the film thickness of the barrier metal layer 11, when the ion conducting layer 12 is formed by sputtering, the barrier metal layer 11 changes to an ion conducting layer. As a result, a multilayer (laminate) structure of the first electrode/the ion conducting layer is formed.

In addition, if the barrier metal layer 11 is oxidized in a process after the ion conducting layer 12 is formed, by adjusting the film thickness of the barrier metal layer 11, the barrier metal layer 11 can be changed to an ion conducting layer without oxidizing the first electrode 5 when all the manufacturing processes are completed.

In addition, in step A3, the second electrode 13 can be formed as a multilayer laminate of ruthenium having a film thickness of 10 nm and tantalum having a film thickness of 50 nm. If made of ruthenium and tantalum, the second electrode 13 can be formed by a DC sputtering method under argon atmosphere.

In addition, in step A3, before the barrier metal layer 11 is formed, it is preferable that a heat treatment be executed at a temperature of approximately 350° C. under a reduced pressure for degassing, in order to remove moisture attached to the opening in the second barrier insulating film 7. In this process, care is required not to oxidize the copper surface of the first wiring 5 again. For example, the process needs to be executed under an inert atmosphere such as under vacuum or under nitrogen atmosphere.

In addition, in step A3, in the photolithography method, a photoresist is used to pattern a portion that needs to remain as the switching element 10. By using the photoresist as a mask and executing dry etching, the hard mask film in the region other than the portion that needs to remain as the switching element 10 is etched and removed. Next, the photoresist is removed by using oxygen plasma ashing and organic stripping.

In addition, in step A3, when the second electrode 13, the ion conducting layer 12, and the barrier metal layer 11 are continuously etched by using the hard mask, for example, the tantalum, which is a component of the second electrode 13, can be processed by chlorine-based reactive etching, the ruthenium can be processed by reactive etching using a mixed gas of chlorine and oxygen. In addition, the tantalum oxide or tantalum silicon oxide, which is a component of the ion conducting layer 12, can be processed by reactive etching. In this etching, a carbon tetrafluoride-based gas, a mixed gas of carbon tetrafluoride and chlorine, a mixed gas of carbon tetrafluoride/chlorine/argon, or the like is used, and etching conditions are adjusted. By using such hard mask reactive etching method, the switching element 10 can be processed without being exposed to the oxygen plasma ashing for removal of the resist film. In addition, if an oxidation treatment by oxygen plasma is executed after the process, the oxidation plasma treatment can be carried out irrespective of the stripping time of the resist.

Next, the protective insulating film 14 (a silicon nitride film, for example) is formed on the second barrier insulating film 7 and the switching element 10. thereafter, the second interlayer insulating film 15 (a silicon oxide film, for example) is formed on the protective insulating film 14. Next, the third barrier insulating film 16 (a silicon nitride film, for example) is formed on the second interlayer insulating film 15. Then, the third interlayer insulating film 17 (a silicon oxide film, for example) is formed on the third barrier insulating film 16 (see step A4 in FIG. 3A).

In step A4, while the protective insulating film 14 can be formed by a plasma CVD method, formation of the protective insulating film 14 needs to be executed under reduced pressure in a reaction chamber. In this process, oxygen may be removed from the side surface of the switching element 10 and the leakage current of the ion conducting layer 12 may be increased. To prevent such removal of oxygen, it is preferable that the protective insulating film 14 be formed at a temperature of 250° C. or lower. In addition, since the protective insulating film 14 is exposed to film formation gas under reduced pressure before formed, it is preferable that reducing gas not be used to form the protective insulating film 14. Thus, it is preferable that a silicon nitride film or the like formed by using a high-density plasma of a mixed gas of silane/nitrogen at a substrate temperature of 200° C. be used as the protective insulating film 14, for example.

Next, a trench for the wiring portion of the second wiring 19 is formed in the third interlayer insulating film 17, and a prepared hole for the plug portion 19a of the second wiring 19 is formed in the third barrier insulating film 16, the second interlayer insulating film 15, and the protective insulating film 14. Next, the second barrier metal (titanium, for example) is formed on a surface of the third interlayer insulating film 17 as well as on the trench and the prepared hole. Next, the second wiring 19 (copper, for example) is formed on the second barrier metal 20. Next, the second wiring 19 and the second barrier metal 20 are planarized by CMP until the third interlayer insulating film 17 appears. Next, the fourth barrier insulating film 22 is formed on the third interlayer insulating film 17 including the second barrier metal 20 and the second wiring 19 (see step A5 in FIG. 3B). In this way, the second wiring 19 is embedded in the trench and the prepared hole via the second barrier metal 20.

In step A5, the trench and the prepared hole may be formed simultaneously. Alternatively, one of the trench and the prepared hole may be formed first and the other may be formed next. The second wiring 19 formed in the trench and the prepared hole is formed by using a dual-damascene wiring process. The wiring portion and the plug portion 19a are formed simultaneously. The same processes as those used to form the lower-layer first wiring 5 can be used to form the second wiring 19.

In addition, in step A5, the second interlayer insulating film 15 and the third interlayer insulating film 17 can be formed by plasma CVD. In addition, the second interlayer insulating film 15 and the third interlayer insulating film 17 may be made of an identical material.

In addition, in step A5, the third barrier insulating film 16 may be deleted, depending on selection of etching conditions of the trench (depending on a combination of materials used for the second interlayer insulating film 15 and the third interlayer insulating film 17).

In addition, in step A5, to control the step differences formed by the switching element 10, the second interlayer insulating film 15 may be thickly deposited first. In this case, by polishing the second interlayer insulating film 15 by CMP for planarization next, the second interlayer insulating film 15 can be formed to have a desired film thickness.

Next, observation/measurement results of a first sample (example 1-1) of the switching element according to example 1 of the present invention will be described with reference to the drawings. FIG. 4 (FIGS. 4A-4C) shows cross sections schematically illustrating some of the manufacturing steps of the switching element according to example 1-1 of the present invention. FIG. 5 is an electron microscope photograph of a formed ion conducting layer of the switching element according to example 1-1 of the present invention.

To form the first sample, copper (Cu) was used as the first electrode 5, tantalum oxide (TaO) as the ion conducting layer 12, and tantalum (Ta) as the barrier metal layer 11. The manufacturing processes of the first sample will be hereinafter described.

First, after tantalum (film thickness: 5 nm) and copper seed (film thickness: 10 nm) are formed in this order by a sputtering method on the semiconductor substrate 1 having a surface covered with oxide silicon, the copper is allowed to grow by a plating method (film thickness: 600 nm). Next, by using a chemical-mechanical polishing (CMP) method, the copper is thinned to achieve a film thickness of 300 nm and to reduce the surface irregularity as much as possible. In this process, the first electrode 5 made of copper is formed.

Next, tantalum having a film thickness of 3 nm, which serves as the barrier metal layer 11, is formed by a sputtering method. The sputtering is executed by using a DC sputtering power of 1 kW in argon atmosphere (see FIG. 4A).

Next, a mixed gas of argon and oxygen with a mixture ratio of 4:1 is introduced into a sputtering chamber, and an RF sputtering method is executed by using tantalum oxide as a target to form the ion conducting layer 12. The tantalum oxide is deposited until a film thickness of approximately 13 nm is achieved (see FIGS. 4B and 4C). In this process, the substrate is not heated. The film is formed at room temperature.

After the tantalum oxide was sputtered, the surface was observed. It was found that, upon completion of the sputtering of FIG. 4C, no roughness was observed on the surface of the first electrode 5 and no oxidation of the copper was observed (see FIG. 5).

In addition, composition analyses showed that, upon completion of the sputtering of FIG. 4C, tantalum of the barrier metal layer 11 was oxidized and changed to tantalum oxide. During the sputtering to form the ion conducting layer 12, the tantalum of 3 nm was completely oxidized. If completely oxidized, the barrier metal layer 11 is homogenized with the ion conducting layer 12 made of tantalum oxide. It was also found that, if the tantalum has a film thickness of 5 nm, part of the tantalum remains without being oxidized.

If the barrier metal layer 11 is oxidized and homogenized with the ion conducting layer 12 made of tantalum oxide, copper of the first electrode 5 is converted into copper ions and the copper ions are easily diffused into the tantalum oxide during a heat treatment. In addition, an annealing treatment was executed on a sample obtained after the sputtering of FIG. 4C under a nitrogen atmosphere at 350° C. for 30 minutes. It was observed that copper of the first electrode 5 was diffused into the tantalum oxide of the barrier metal layer 11 and the ion conducting layer 12.

To prevent thermal diffusion of the metal material of the first electrode 5 into the ion conducting layer 12, for example, the following measures need to be taken: (1) increasing the film thickness of the barrier metal layer 11; (2) using tantalum nitride to form the barrier metal layer 11; (3) decreasing the film formation temperature for the sputtering to form the ion conducting layer 12 (specifically, the temperature is set to room temperature), and (4) making the ion conducting layer 12 with a material that does not easily allow thermal diffusion.

Next, observation results of a second sample (example 1-2) of the switching element according to example 1 of the present invention will be described with reference to the drawings. FIG. 6 (FIGS. 6A-6C) shows cross sections schematically illustrating some of the manufacturing steps of the switching element according to example 1-2 of the present invention.

To form the second sample, tantalum silicon oxide (TaSiO) was used as the ion conducting layer 12, tantalum (Ta) as the barrier metal layer 11, and copper (Cu) as the first electrode 5. The film thickness of the tantalum of the barrier metal layer 11 was adjusted, so that the tantalum of the barrier metal layer 11 would be changed into tantalum oxide upon completion of the manufacturing processes of the switching element. In this way, an ion conducting layer including two layers of the tantalum silicon oxide of the ion conducting layer 12 and the tantalum oxide of the barrier metal layer 11 is formed. The manufacturing process of the second sample will be hereinafter described.

First, as in example 1-1, the first electrode 5 and the barrier metal layer 11 are formed on the semiconductor substrate 1 having a surface covered with an insulating film (see FIG. 6A). Next, a tantalum silicon oxide film (film thickness: 13 nm) is formed by a sputtering method to form the ion conducting layer 12. The tantalum silicon oxide film is formed by introducing a mixed gas of argon and oxygen with a mixture ratio of 4:1 into a sputtering chamber and executing RF sputtering with tantalum silicon oxide as a target. After the sputtering, a heat treatment is executed under nitrogen atmosphere at 350° C. for 30 minutes (see FIG. 6B).

In this way, during the sputtering, the tantalum of the barrier metal layer 11 changes to tantalum oxide, and during the heat treatment, copper is easily diffused into the tantalum oxide. The tantalum silicon oxide of the ion conducting layer 12 has a smaller copper diffusion coefficient than that of the tantalum oxide. Thus, the probability that the copper is diffused into the tantalum silicon oxide of the ion conducting layer 12 by the heat treatment is smaller than the probability that the copper is diffused into the tantalum oxide.

Next, the second electrode 13 made of platinum (Pt) is formed on the ion conducting layer 12 (see FIG. 6C). The platinum (film thickness: 50 nm) was formed by masking the portion other than the electrode portion with a stencil mask and executing vacuum deposition. In this way, the switching element identical to that of example 1 (see FIG. 1) can be formed.

Next, a rewrite operation of the second sample (example 1-2) of the switching element according to example 1 of the present invention will be described with reference to the drawings. FIGS. 7A to 7C schematically illustrate the rewrite operation of the switching element according to example 1-2 of the present invention: FIG. 7A, the switching element in a low resistance state; FIG. 7B, a bridge having been cut off; and FIG. 7C, a metal bridge having been recovered as metal. In FIGS. 7A to 7C, the semiconductor substrate is not illustrated.

In the rewrite operation of the switching element, first, when the first electrode 5 (copper) is connected to ground and a negative voltage is applied to the second electrode 13 (platinum), a metal bridge 5a made of copper of the first electrode 5 is formed in the barrier metal layer 11 (tantalum oxide) and the ion conducting layer 12 (tantalum silicon oxide). As a result, the switching element is brought in a low resistance state (see FIG. 7A).

On the other hand, when the first electrode 5 is connected to ground and a positive voltage is applied to the second electrode 13, the metal bridge (5a in FIG. 7A) is divided into bridge metal portions 5a1 and 5a2. As a result, the switching element is brought in a high resistance state. The cut-off position is in the barrier metal layer 11. The copper ions are diffused at a greater rate in the barrier metal layer 11 than in the ion conducting layer 12. The cut-off position is near the interface between the barrier metal layer 11 and the ion conducting layer 12 (see FIG. 7B). The metal bridge portion at the cut-off position is mainly diffused as metal ions into the barrier metal layer 11.

After the metal bridge 5a is divided (cut-off) into the bridge metal portions 5a1 and 5a2, if the connection of the first electrode 5 to ground is maintained and a positive voltage is continuously applied to the second electrode 13, the metal bridge portion (5a1 in FIG. 7B) remaining near the second electrode 13 is changed into copper ions. The copper ions are then attracted to the first electrode 5 and recovered as metal by the first electrode 5 as copper. Finally, the metal bridge portion (5a1 in FIG. 4B) is eliminated from the ion conducting layer 12, and the switching element is brought in a stable high resistance state (see FIG. 7C). If the metal bridge portion remains in the ion conducting layer 12, the insulation resistance (resistance to breakdown of insulation) between the first electrode 5 and the second electrode 13 is decreased more significantly. However, based on the present configuration, since the metal bridge portion does not remain in the ion conducting layer 12, the decrease of the insulation resistance is less.

According to example I, when the ion conducting layer 12 is formed, oxidation of the first wiring 5 (first electrode) can be prevented by the barrier metal layer 11. Namely, when sputtering for the ion conducting layer 12 is executed under an oxygen atmosphere, the barrier metal layer 11 on the first electrode 5 prevents transmission of oxygen. If oxygen is not supplied to the first wiring 5 (first electrode), the first wiring 5 (first electrode) is not oxidized.

In addition, according to example 1, before oxidized, the barrier metal layer 11 on the first electrode 5 can prevent thermal diffusion of the metal of the first electrode 5.

In addition, according to example 1, if the ion conducting layer between the first electrode 5 and the second electrode 13 includes two or more layers of different ion conducting layers, an ion conducting layer having a larger metal-ion diffusion coefficient is arranged near the first electrode 5. In this way, since the metal bridge is cut off at a position near the first electrode 5, the insulation resistance (resistance to breakdown of insulation) during switching is improved.

Next, as a comparative example, the following case is scrutinized in which a first electrode 105 made of copper is formed on a semiconductor substrate 101 having a surface covered with an insulating film, and an ion conducting layer 112 made of tantalum oxide is formed on the first electrode 105 by a sputtering method, as illustrated in FIGS. 8A and 8B. The comparative example will be hereinafter described. In the comparative example, by using tantalum oxide as a sputter target, the semiconductor substrate 101 on which the first electrode 105 is formed is heated to 350° C. A mixed gas of argon and oxygen with a mixture ratio of 4:1 is introduced into a vacuum chamber and plasma was generated (see FIG. 8A). The introduction of oxygen is effective in preventing removal of oxygen by the sputtering and in depositing a film substantially the same as the sputter target (tantalum oxide) on the first electrode 105 (see FIG. 8B). Without the introduction of oxygen, the composition of the sputter-target tantalum oxide lacks the oxygen composition. As a result, only a film having a low insulation resistance (resistance to breakdown of insulation) can be obtained.

FIG. 9 is an electron microscope photograph taken after the tantalum oxide is sputtered. It was found that the first electrode 105 (copper) was completely oxidized and had a rough surface. Visual inspection also confirmed that the color of the first electrode 105 was changed from copper color (before the tantalum oxide was sputtered) to black (after the tantalum oxide was sputtered). In addition, it was confirmed that copper of the first electrode 105 was diffused into the deposited tantalum oxide (ion conducting layer 112). If copper is diffused into the tantalum oxide, insulation properties of the tantalum oxide are decreased, counted as a disadvantage. It is well known that a heat treatment on tantalum oxide and copper that are in contact with each other causes thermal diffusion of the copper.

FIG. 10 (FIGS. 10A to 10C) shows a rewrite operation of a switching element including the ion conducting layer 112 in FIG. 8B on which a second electrode 113 made of platinum is formed. When the first electrode 105 (copper) is connected to ground and a negative voltage is applied to the second electrode 113 (platinum), a metal bridge 105a made of copper of the first electrode 105 is formed in the ion conducting layer 112 (tantalum oxide). As a result, the switching element is brought in a low resistance state (see FIG. 10A).

On the other hand, when the first electrode 105 is connected to ground and a positive voltage is applied to the second electrode 113, the metal bridge (105a in FIG. 10A is divided into bridge metal portions 105a1 and 105a2). As a result, the switching element is brought in a high resistance state (see FIG. 10B). The cut-off position. of the bridge metal 105a varies depending on the switching cycle.

In addition, after the metal bridge 105a is divided into the bridge metal portions 105a1 and 105a2, if the connection of the first electrode 105 to ground is maintained, a positive voltage is continuously applied to the second electrode 113, and the cut-off position of the metal bridge 105a is near the second electrode 113, a large part of the metal bridge portion 105a2 remains in the ion conducting layer 112 (tantalum oxide) (see FIG. 10C). Thus, the insulation resistance (resistance to breakdown of insulation) of the comparative example between the first electrode 105 and the second electrode 113 is lower than that of example 1-2 (see FIG. 7C).

Modifications and adjustments of the exemplary embodiments and examples are possible within the scope of the overall disclosure (including claims) of the present invention and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

EXPLANATION OF SYMBOLS 1 semiconductor substrate
2 first wiring layer
3 first barrier insulating film
4 first interlayer insulating film
5 first wiring (first electrode)
5a bridge metal
5a1, 5a2 bridge metal portion
6 first barrier metal
7 second barrier insulating film
10 switching element
11 barrier metal layer (first ion conducting layer)
12 ion conducting layer (second ion conducting layer)
13 second electrode
14 protective insulating film
15 second interlayer insulating film
16 third barrier insulating film
17 third interlayer insulating film
18 plug layer
19 second wiring
19a plug portion
20 second barrier metal
22 fourth barrier insulating film
24 second wiring layer
30 semiconductor device
31 multilevel wiring layer structure
101 semiconductor substrate
105 first wiring (first electrode)
105a bridge metal
105a1, 105a2 bridge metal portion
112 ion conducting layer
113 second electrode

What is claimed is:
1. A switching element, comprising:
a first electrode supplying metal ions;
a second electrode less ionizable than the first electrode; and an ion conducting layer arranged between the first electrode and the second electrode and containing a metal oxide that can conduct the metal ions, wherein the ion conducting layer includes two or more layers of different types; and wherein one of the ion conducting layers that is closest to the first electrode has a larger diffusion coefficient for the metal ions than that of the other ion conducting layer(s), wherein the ion conducting layer includes two layers of a first ion conducting layer near the first electrode and a second ion conducting layer near the second electrode; and wherein the first ion conducting layer contains tantalum oxide and the second ion conducting layer contains tantalum silicon oxide.

2. The switching element according to claim 1, wherein the first electrode is formed of copper and the second electrode is formed of platinum.

3. A switching element, comprising:
a first electrode supplying metal ions;
a second electrode less ionizable than the first electrode; and
an ion conducting layer arranged between the first electrode and the second electrode and containing a metal oxide that can conduct the metal ions,
wherein the ion conducting layer includes two or more layers of different types; and
wherein one of the ion conducting layers that is closest to the first electrode has a larger diffusion coefficient for the metal ions than that of the other ion conducting layer(s),
a barrier insulating film arranged between the first electrode and the ion conducting layer and having an opening for connecting the first electrode and the ion conducting layer; and
a protective insulating film that covers the second electrode and the ion conducting layer for protection and is bonded to the barrier insulating film at the periphery of the second electrode and the ion conducting layer;
wherein the protective insulating film is formed of a material identical to that of the barrier insulating film.

4. A switching element, comprising:
a first electrode supplying metal ions;
a second electrode less ionizable than the first electrode; and
an ion conducting layer arranged between the first electrode and the second electrode and containing a metal oxide that can conduct the metal ions,
wherein the ion conducting layer includes two or more layers of different types; and
wherein one of the ion conducting layers that is closest to the first electrode has a larger diffusion coefficient for the metal ions than that of the other ion conducting layer(s);
wherein the first electrode is a first wiring arranged closer to a substrate than the ion conducting layer is to the substrate in a semiconductor device;
wherein the second electrode is arranged farther from the substrate than the ion conducting layer is from the substrate in the semiconductor device and is electrically connected to a second wiring in an upper layer;
wherein the second wiring is embedded in a trench or a prepared hole formed in an interlayer insulating film;
wherein the switching element further comprises a barrier metal arranged between the second electrode and the second wiring and between the interlayer insulating film and the second wiring; and
wherein said barrier metal is a material identical to that of the second electrode.

5. A switching element, comprising:
a first electrode supplying metal ions;
a second electrode less ionizable than the first electrode; and
an ion conducting layer arranged between the first electrode and the second electrode and containing a metal oxide that can conduct the metal ions,
wherein the ion conducting layer includes two or more layers of different types;
wherein one of the ion conducting layers that is closest to the first electrode has a larger diffusion coefficient for the metal ions than that of the other ion conducting layer(s);
wherein the first electrode is a first wiring arranged closer to a substrate than the join conducting layer is to the substrate in a semiconductor device;
wherein the second electrode is arranged farther from the substrate than the ion conducting layer is from the substrate in the semiconductor device and is electrically connected to a second wiring in an upper layer;
wherein the second wiring is embedded in a trench or a prepared hole formed in an interlayer insulating film;
wherein the switching element further comprises a barrier metal arranged between the second electrode and the second wiring and between the interlayer insulating film and the second wiring;
wherein said barrier metal is a material identical to that of the second electrode; and
wherein the first electrode is formed of copper and the second electrode is formed of platinum.

6. A switching element manufacturing method, comprising:
forming a barrier metal layer preventing oxidation of the first electrode on a first electrode supplying metal ions;
forming an ion conducting layer containing a metal oxide that can conduct the metal ions on the barrier metal layer; and
forming a second electrode less ionizable than the first electrode on the ion conducting layer;
wherein said forming the ion conducting layer is executed in an oxygen atmosphere.

7. The switching element manufacturing method according to claim 6,
wherein the barrier metal layer is formed of tantalum, tantalum nitride, or a laminate of these materials; and
wherein the metal oxide is formed of tantalum oxide or tantalum silicon oxide.

8. The switching element manufacturing method according to claim 6, wherein the first electrode is formed of copper, and the second electrode is formed of platinum.

9. The switching element manufacturing method according to claim 6,
wherein a heat treatment is executed in an arbitrary step after said forming the ion conducting layer; and
wherein metal of the first electrode is diffused by the heat treatment.

* * * * *